(12) United States Patent
Daicho et al.

(10) Patent No.: US 8,754,432 B2
(45) Date of Patent: Jun. 17, 2014

(54) LIGHT EMITTING DEVICE
(75) Inventors: Hisayoshi Daicho, Shizuoka (JP); Tatsuya Matsuura, Shizuoka (JP); Ken Kato, Shizuoka (JP); Kiminori Enomoto, Shizuoka (JP)
(73) Assignee: Koito Manufacturing Co., Ltd., Tokyo (JP)
( * ) Notice: Subject to any disclaimer, the term of this patent is extended or adjusted under 35 U.S.C. 154(b) by 0 days.
(21) Appl. No.: 13/582,384
(22) PCT Filed: Feb. 8, 2011
(86) PCT No.: PCT/JP2011/000681
  § 371 (c)(1),
  (2), (4) Date: Oct. 4, 2012
(87) PCT Pub. No.: WO2011/108194
  PCT Pub. Date: Sep. 9, 2011
(65) Prior Publication Data
  US 2013/0020601 A1   Jan. 24, 2013
(30) Foreign Application Priority Data
  Mar. 3, 2010 (JP) ................. 2010-046130
(51) Int. Cl.
  *H01L 33/50* (2010.01)
  *H01L 33/52* (2010.01)
(52) U.S. Cl.
  USPC 257/98; 257/100; 257/E33.059; 257/E33.061
(58) Field of Classification Search
  USPC ............................................. 257/98, 99, 100
  See application file for complete search history.

(56) References Cited
U.S. PATENT DOCUMENTS
2008/0253951 A1* 10/2008 Daicho et al. ................. 423/263

FOREIGN PATENT DOCUMENTS

| JP | 10107325 A | 4/1998 |
|---|---|---|
| JP | 11046019 A | 2/1999 |
| JP | 2002185048 A | 6/2002 |
| JP | 2003110150 A | 4/2003 |
| JP | 2004115633 A | 4/2004 |
| JP | 2006148051 A | 6/2006 |
| JP | 2007204730 A | 8/2007 |
| JP | 2008016647 A | 1/2008 |
| JP | 2008140934 A | 6/2008 |
| JP | 2009038348 A | 2/2009 |
| JP | 2009091546 A | 4/2009 |
| JP | 2009231785 A | 10/2009 |
| JP | 2010027974 A | 2/2010 |

OTHER PUBLICATIONS

Study on luminous efficacy against various layered-phosphor arrangements in multi-layered phosphor-conversion light emitting diodes; J. Takeshita, K. Kamon, H. Hayashi, Y. Uchida, S. Kurai and T. Taguchi; Graduate School of Science and Engineering and Faculty of Engineering, Yahaguchi University; 4 pages; 2009.
International Preliminary Report on Patentability, Sep. 4, 2012, 7 pages.
International Search Report, Japanese Patent Office, Apr. 5, 2011, 4 pages.
Japanese Office Action for corresponding Japanese Patent Appln. No. 2010-046130 dated Jul. 2, 2013, with English translation thereof (6 pages).
Japanese Office Action (Decision of Refusal) dated Mar. 18, 2014, issued in corresponding Japanese Patent Application No. 2010-046130 with English translation thereof. (4 pgs).

* cited by examiner

*Primary Examiner* — Matthew W Such
*Assistant Examiner* — Scott Stowe
(74) *Attorney, Agent, or Firm* — Buchanan Ingersoll & Rooney PC

(57) ABSTRACT

A light emitting device is configured to achieve a white color by mixing light from respective phosphors. The light emitting device includes: a light emitting element for emitting ultraviolet or short-wavelength visible light having a peak wavelength in a wavelength range of 380 to 420 nm; a first phosphor excited by the ultraviolet or short-wavelength visible light to emit visible light having a peak wavelength in a wavelength range of 560 nm to 600 nm; a second phosphor excited by the ultraviolet or short-wavelength visible light to emit visible light having a complementary relationship with visible light emitted by the first phosphor; and a light transmitting member which is a light transmitting layer for covering the light emitting element, and has the first phosphor and the second phosphor dispersed therein.

14 Claims, 14 Drawing Sheets

LIGHT EMITTING DEVICE

CROSS-REFERENCE TO RELATED APPLICATIONS

This application is based upon and claims the benefit of priority from the prior Japan Patent Application No. PCT/JP2011/000681, filed on Feb. 8, 2011, which claims priority from JP 2010-046130 filed Mar. 3, 2010, the entire contents of which are incorporated herein by reference.

FIELD OF THE INVENTION

The present invention relates to a light emitting device using a phosphor (fluorescent body) which is efficiently excited by ultraviolet or short-wavelength visible light to produce luminescence.

DESCRIPTION OF THE RELATED ART

Conventionally, a semiconductor light emitting element for emitting blue light, which is configured in combination with a fluorescent material for absorbing blue light and emitting light in a wavelength range of green to red, have been known as a semiconductor light emitting device for emitting white light (see Patent Document 1). This configured light emitting device has a quite simple structure, and can be thus produced inexpensively. The structure is configured by placing the semiconductor light emitting element for emitting blue light on the bottom of the cup shape, and pouring a binder containing a phosphor so as to coat the semiconductor light emitting element. In this case, some of blue light emitted from the semiconductor light emitting element is absorbed by the phosphor, and the phosphor emits light in a wavelength range of green to red, depending on the absorbed light. As a result, white light is achieved by additive color mixing of the blue light transmitted without being absorbed by the phosphor with the green to red light emitted from the phosphor. In addition, ink-jet printing, stencil printing, etc. have been considered as the method for providing the binder containing the phosphor on the semiconductor light emitting element (see Patent Documents 2 and 3).

CITATION LIST

Patent Documents

[Patent Document 1] Japanese Patent Application Laid-Open No. 10-107325
[Patent Document 2] Japanese Patent No. 3546650
[Patent Document 3] Japanese Patent No. 4208449

Non-Patent Documents

[Non-Patent Document 1] Taguchi et al, "19th Microelectronics Symposium, Collection of Papers", 2009, p. 197

DISCLOSURE OF THE INVENTION

Problems to be Solved by the Invention

However, the light emitting devices described in Patent Document 1 and Patent Document 2 fail to achieve radiation light which is uniform in color. This is because the amount of radiation light from the semiconductor light emitting element, which passes through the phosphor containing binder paste, varies from area to area, due to the non-uniform thickness of the phosphor containing binder paste for coating the semiconductor light emitting element. The area with the phosphor containing binder paste increased in thickness has a tendency to appear in a yellow color, whereas the area with the paste decreased in thickness has a tendency to appear in a blue color. In particular, the human sensation of color hue is sensitive in white color, and feels a feeling of strangeness even against a slight difference in color hue. As a result, the production of a semiconductor light emitting device with color hue variability suppressed decreases the yield, thereby resulting in a failure to provide inexpensiveness.

Thus, the method described in Patent Document 3 or Patent Document 4 uniformly controls the thickness of the phosphor containing binder, thereby making it possible to suppress the difference in the chromaticity of light radiated from the light emitting device, due to the radiation angle. On the other hand, chromaticity fluctuation for individual light emitting devices is out of control, and it is difficult to achieve an adequate yield. In addition, the light emitting area of the white LED is decreased when the phosphor layer is densely applied in a thin film around the semiconductor light emitting layer in order to eliminate chromaticity fluctuation by the method mentioned previously. As a result, the luminance of the white LED is increased excessively, and thus, when an illuminator is created with the use of a plurality of LEDs, luminance variability, illuminance variability, etc. are more likely to be caused.

In response to this problem, when the light emitting area of the white LED is increased, with the phosphor layer formed thickly so as to prevent luminance variability, color hue variability is caused in the LED surface. Furthermore, when this white LED is used for a light source of an illuminator, the chromaticity will vary depending on the irradiation direction, and the LED is not suitable for a light source for lighting.

The present invention has been achieved in view of these circumstances, and an object of the present invention is to provide a light emitting device which has chromaticity variability suppressed in a light emitting surface.

Means for Solving the Problems

In order to solve the above problems, a light emitting device according to an aspect of the present invention is configured to achieve a white color by mixing light from respective phosphors, the light emitting device including: a light emitting element for emitting ultraviolet or short-wavelength visible light having a peak wavelength in a wavelength range of 380 to 420 nm; a first phosphor excited by the ultraviolet or short-wavelength visible light to emit visible light having a peak wavelength in a wavelength range of 560 nm to 600 nm; a second phosphor excited by the ultraviolet or short-wavelength visible light to emit visible light having a complementary relationship with visible light emitted by the first phosphor; and a light transmitting member which is a light transmitting layer for covering the light emitting element, and has the first phosphor and the second phosphor dispersed therein, wherein the volume concentration of all of the phosphors contained in the light transmitting member is 0.05 vol % or more and 10 vol % or less, and the light transmitting member is configured to have an optical path length of 0.4 mm or more and 20 mm or less from incidence of light from the light emitting element to exit thereof to the outside.

According to this aspect, white light is achieved by mixing visible light with a peak wavelength in a wavelength range of 560 nm to 600 nm, which is emitted from the first phosphor excited by ultraviolet or short-wavelength visible light, with visible light which has a complementary relationship with visible light emitted by the first phosphor, which is emitted by the second phosphor excited by ultraviolet or short-wavelength visible light. Therefore, the chromaticity fluctuation is suppressed in the light emitting surface, as compared with a light emitting device which has a blue light emitting element combined with a yellow phosphor. In addition, the volume concentration of the phosphors in the light transmitting member and the optical path length are set appropriately to cause the phosphors to efficiently absorb light emitted by the light emitting element, and suppress the absorption and scattering of light emitted by the phosphor in and on the other phosphor.

The first phosphor may have an average grain size of 0.5 µm or more and 100 µm or less, and the second phosphor may have an average grain size of 0.5 µm or more and 100 µm or less. This makes it easy to disperse the phosphors in the light transmitting member, and makes it possible to efficiently emit light.

When Imax and Ia respectively are assumed to denote the maximum intensity of an excitation spectrum for the first phosphor and the intensity of the excitation spectrum for the first phosphor at a peak wavelength of an emission spectrum for the second phosphor, Ia<0.5×Imax may be satisfied. This prevents light emitted from the second phosphor from being absorbed by the first phosphor to produce luminescence again.

The first phosphor may be represented by a general formula (M2x, M3y, M4z)mM1O3X(2/n) (where M1 represents one or more elements including at least Si, which are selected from the group consisting of Si, Ge, Ti, Zr, and Sn, M2 represents one or more elements including at least Ca, which are selected from the group consisting of Ca, Mg, Ba, and Zn, M3 represents one or more elements including at least Sr, which are selected from the group consisting of Sr, Mg, Ba, and Zn, X represents at least one halogen element, and M4 represents one or more elements including at least Eu2+, which are selected from the group consisting of rare-earth elements and Mn. In addition, m may fall within the range of 1≤m≤4/3, and n may fall within the range of 5≤n≤7. In addition, x, y, z may fall within ranges which satisfy x+y+z=1, 0<x<0.99, 0<y<0.99, 0.01≤z≤0.3).

The second phosphor may emit visible light with a peak wavelength in a wavelength range of 430 nm to 480 nm. For example, the second phosphor is represented by a general formula M1a (M2O4)bXc:Red (where M1 represents one or more elements including at least any of Ca, Sr, and Ba, which are selected from the group consisting of Ca, Sr, Ba, Mg, Zn, Cd, K, Ag, and Tl, M2 represents one or more elements including at least P, which are selected from the group consisting of P, V, Si, As, Mn, Co, Cr, Mo, W, and B, X represents at least one halogen element, and Re represents one or more elements including at least Eu2+, which are selected from the group consisting of rare-earth elements and Mn. In addition, a may fall within the range of 4.2≤a≤5.8, b may fall within the range of 2.5≤b≤3.5, c may fall within the range of 0.8≤c≤1.4, and d may fall within the range of 0.01<d<0.1.).

It is to be noted that any combinations of the components mentioned above, as well as representation conversions in the present invention among a method, an apparatus, a system, etc., are also effective as aspects of the present invention.

Effect of the Invention

According to the present invention, a light emitting device can be provided which has chromaticity fluctuation suppressed in the light emitting surface.

BEST MODE FOR CARRYING OUT THE INVENTION

Figure 1:
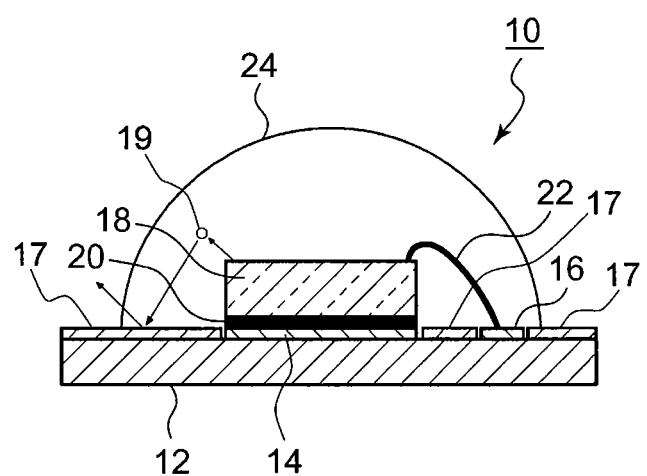
FIG. 1 is a schematic cross-sectional view of a light emitting device according to a first embodiment.

In recent years, a light emitting device has been created which uses, as a primary light source, an LED (hereinafter, referred to as an nUV-LED) for emitting near-ultraviolet or short-wavelength visible light, and moreover mounts one or more phosphors for emitting visible light of any color. In order to achieve white light in this configured light emitting device, there is a need to mount multiple phosphors. Examples of the combination of multiple phosphors include, for example, two colors of blue and yellow, three colors of blue, green, and red, and four colors of blue, green, orange, and red.

In the case of using these multiple phosphors, multiexcitation (hereinafter, referred to as "cascade excitation") is caused in which one of the phosphors with the shortest peak wavelength is excited by excitation light emitted from a light emitting element, and primary fluorescence emitted from the excited phosphor is absorbed by the other phosphor with a peak wavelength longer than that of the excited phosphor to excite the other phosphor. Therefore, the increased thickness of the phosphor layer, that is, the longer optical path length is more likely to cause multiexcitation, and shifts the luminescent color to the longer wavelength side. This event is also confirmed in "Taguchi et al, 19th Microelectronics Symposium, Collection of Papers (2009), p. 197".

The inventor has conceived of the invention of present application in consideration of the event described above, the performance required for the light emitting device, the productivity and manufacturing cost of the light emitting device, etc.

Embodiments of the present invention will be described below in detail with reference to the drawings. It is to be noted that the same elements are denoted by the same reference numerals in the description of the drawings, and overlapping descriptions will be omitted appropriately.

First Embodiment

FIG. 1 is a schematic cross-sectional view of a light emitting device according to a first embodiment. The light emitting device 10 shown in FIG. 1 has a pair of an electrode 14 (anode) and an electrode 16 (cathode) formed on a substrate 12. A semiconductor light emitting element 18 is fixed onto the electrode 14 with a mounting member 20. The semiconductor light emitting element 18 and the electrode 14 are brought into conduction by the mounting member 20, whereas the semiconductor light emitting element 18 and the electrode 16 are brought into conduction by a wire 22. A domal phosphor layer 24 is formed over the semiconductor light emitting element 18. Reflecting surfaces 17 are formed on the substrate 12 in the region without the electrodes 14, 16 and the semiconductor light emitting element 18 provided. Methods for forming the reflecting surfaces 17 include the following method. First, the electrode section is formed on the substrate 12, and white acrylic or urethane reflective coating is applied onto the electrode section provided with a mask. Then, the mask is removed, and the light emitting element 18 is mounted. Thus, as shown in FIG. 1, even when luminescence produced by a phosphor 19 excited by light emitted upward from the light emitting element 18 travels toward the substrate 12, the luminescence is reflected upward again by the reflecting surface 17. Thus, some of luminescence produced from the phosphor 19, which travels toward the substrate 12, can be also utilized for illumination, thus making an improvement in light extraction efficiency.

The substrate 12 is preferably formed from a material which has no electrical conductivity, but has high thermal conductivity, for which ceramic substrates (aluminum nitride substrates, alumina substrates, mullite substrates, glass ceramic substrates), glass epoxy substrates, and the like can be used, for example.

The electrode 14 and the electrode 16 are electrically conductive layers formed from metal materials such as gold and copper.

The semiconductor light emitting element 18 is an example of a light emitting element for use in the light emitting device according to the present invention, for which, for example, LEDs, LDs, and the like can be used which emit ultraviolet light or short-wavelength visible light. Specific examples can include InGaN based compound semiconductors. The InGaN based compound semiconductors undergo changes in emission wavelength range depending on the In content. The higher content of In shows a tendency to result in a longer emission wavelength, whereas the lower content of In shows a tendency to result in a shorter emission wavelength, and it has been confirmed that an InGaN based compound semiconductor containing In to the extent of a peak wavelength around 400 nm has the highest quantum efficiency in the light emission. The semiconductor light emitting element 18 according to the present embodiment preferably emits ultraviolet light or short-wavelength visible light with a peak wavelength in a wavelength range of 380 to 420 nm.

The mounting member 20 is, for example, an electrically conductive adhesive such as a silver paste, a gold-tin eutectic solder, or the like, which fixes the lower surface of the semiconductor light emitting element 18 to the electrode 14 to electrically connect a lower electrode of the semiconductor light emitting element 18 to the electrode 14 on the substrate 12.

The wire 22 is an electrically conducting member such as a gold wire, which is connected to an upper electrode of the semiconductor light emitting element 18 and the electrode 16 by, for example, ultrasonic thermocompression bonding or the like to electrically connect the both.

The phosphor layer 24 has respective phosphors as described later, which are sealed with a binder member in a hemispherical shape (domal shape) covering the upper surface of the substrate 12, including the semiconductor light emitting element 18. The phosphor layer 24 is formed by, for example, preparing a fluorescent paste of the phosphors mixed in a liquid or gel binder member, then applying the fluorescent paste on the upper surface of the semiconductor light emitting element 18 to form a hemispherical shape, and then curing the binder member of the fluorescent paste. As the binder member, for example, silicone resins, fluorine resins, etc. can be used. In addition, binder members are preferable which have excellent resistance performance to ultraviolet light, because the light emitting device according to the present embodiment uses ultraviolet light or short-wavelength visible light as an excitation light source.

In addition, the phosphor layer 24 may have substances mixed therein which have various properties, besides the phosphors. The refractive index of the phosphor layer 24 can be increased by mixing, in the phosphor layer 24, a substance which has a higher refractive index than the binder member, for example, a metal oxide, a fluorine compound, a sulfide, or the like. Thus, the total reflection is reduced which is caused when light generated from the semiconductor light emitting element 18 falls on the phosphor layer 24, thereby achieving the effect of improving the efficiency of excitation light brought into the phosphor layer 24. Furthermore, the particle size of the mixed substance adjusted down to nanosize can increase the refractive index without decreasing the transparency of the phosphor layer 24. In addition, a white powder on the order of 0.3 to 3 μm in average grain size, such as alumina, zirconia, titanium oxide, may be mixed as a light scattering agent into the phosphor layer 24. Thus, luminance variability and chromaticity variability can be prevented in the light emitting surface. The phosphor layer 24 is a light transmitting layer covering the semiconductor light emitting element 18, which functions as a light transmitting member in which a first phosphor and a second phosphor as described later are dispersed.

Second Embodiment

Figure 2:
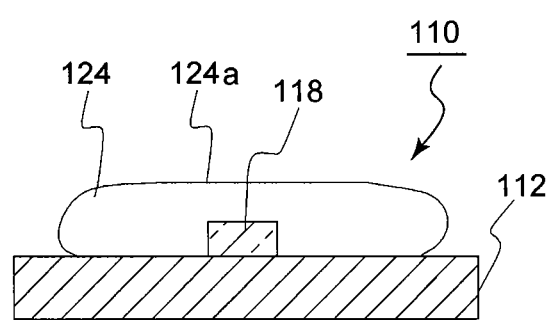
FIG. 2 is a schematic cross-sectional view of a light emitting device according to a second embodiment.

FIG. 2 is a schematic cross-sectional view of a light emitting device according to a second embodiment. The light emitting device 110 according to the second embodiment differs greatly in that the phosphor layer for sealing the semiconductor light emitting element has a different shape, as compared with the light emitting device 10 according to the first embodiment. The structure, which is not particularly mentioned in the following description, is the same as in the first embodiment.

The light emitting device 110 shown in FIG. 2 has a semiconductor light emitting element 118 fixed on a substrate 112 with an electrode (not shown) interposed therebetween. On the semiconductor light emitting element 118, a phosphor layer 124 is formed so as to cover the semiconductor light emitting element 118.

The phosphor layer 124 has a nearly planar upper surface 124a. In addition, the phosphor layer 124 has a horizontally long cross section as shown in FIG. 2, when the light emitting device 110 is viewed from one side. More specifically, the phosphor layer 124 has a nearly cuboid shape. Further, reflecting surfaces (not shown) are formed on the substrate 112 in the same way as in the light emitting device 10 shown in FIG. 1, in the region without the electrodes (not shown) and the semiconductor light emitting element 118 provided.

Next, the respective phosphors for use in the light emitting device according to the present embodiment will be described in detail.

(First Fluorescent Body)

The first phosphor is a phosphor which is excited by ultraviolet or short-wavelength visible light to emit visible light, and a phosphor which is represented by the general formula $(M2_x, M3_y, M4_z) mM1O3X(2/n)$ (where M1 represents one or more elements including at least Si, which are selected from the group consisting of Si, Ge, Ti, Zr, and Sn, M2 represents one or more elements including at least Ca, which are selected from the group consisting of Ca, Mg, Ba, and Zn, M3 represents one or more elements including at least Sr, which are selected from the group consisting of Sr, Mg, Ba, and Zn, X represents at least one halogen element, and M4 represents one or more elements including at least Eu2+, which are selected from the group consisting of rare-earth elements and Mn. In addition, m may fall within the range of $1 \le m \le 4/3$, and n may fall within the range of $5 \le n \le 7$. In addition, x, y, z may fall within ranges which satisfy $x+y+z=1$, $0<x<0.99$, $0<y<0.99$, $0.01 \le z \le 0.3$). In addition, the first phosphor is a phosphor which emits visible light with a peak wavelength in a wavelength range of 560 to 600 nm.

The first phosphor can be obtained, for example, in the following way. For the first phosphor, compounds represented by the following composition formulas (1) to (4) can be used as raw materials.

(1) M'1O2 (M'1 represents a quadrivalent element such as Si, Ge, Ti, Zr, or Sn)
(2) M'2O (M'2 represents a bivalent element such as Mg, Ca, Ba, or Zn)
(3) M'3X2 (M'3 represents a bivalent element such as Mg, Sr, Ba, or Zn, and X represents a halogen element)
(4) M'4 (M'4 represents a rare-earth element such as Eu2+ and/or Mn)

For example, $SiO_2$, $GeO_2$, $TiO_2$, $ZrO_2$, $SnO_2$, and the like can be used as a raw material for the composition formula (1). For example, carbonates, oxides, hydroxides, etc. of bivalent metal ions can be used as a raw material for the composition formula (2). For example, $SrCl_2$, $SrCl_2 \cdot 6H_2O$, $MgCl_2$, $MgCl_2 \cdot 6H_2O$, $BaCl_2$, $BaCl_2 \cdot 2H_2O$, $ZnCl_2$, $MgF_2$, $SrF_2$, $BaF_2$, $ZnF_2$, $MgBr_2$, $SrBr_2$, $BaBr_2$, $ZnBr_2$, $MgI_2$, $SrI_2$, $BaI_2$, $ZnI_2$, and the like can be used as a raw material for the composition formula (3). For example, $Eu_2O_3$, $Eu_2(CO_3)_3$, $Eu(OH)_3$, $EuCl_3$, MnO, $Mn(OH)_2$, $MnCO_3$, $MnCl_2 \cdot 4H_2O$, $Mn(NO_3)_2 \cdot 6H_2O$, and the like can be used as a raw material for the composition formula (4).

As the raw material for the composition formula (1), M'1 preferably contains at least Si. In addition, M'1 may have Si partially substituted with at least one element selected from the group consisting of Ge, Ti, Zr, and Sn. In this case, the raw material is preferably a compound in which the ratio of Si to M'1 is 80 mol % or more. As the raw material for the composition formula (2), M'2 preferably contains at least Ca. In addition, M'2 may have Ca partially substituted with at least one element selected from the group consisting of Mg, Ba, Zn, and the like. In this case, the raw material is preferably a compound in which the ratio of Ca to M'2 is 60 mol % or more. As the raw material for the composition formula (3), M'3 preferably contains at least Sr. In addition, M'3 may have Sr partially substituted with at least one element selected from the group consisting of Mg, Ba, Zn, and the like. In addition, the raw material is preferably a compound of 30 mol % or more of Sr. In addition, as the raw material for the composition formula (3), X preferably contains at least Cl. In addition, X may have Cl partially substituted with other halogen element. In addition, the raw material is preferably a compound in which the ratio of Cl is 50 mol % or more. As the raw material for the composition formula (4), M'4 is preferably a rare-earth element essentially including bivalent Eu, and may contain Mn or rare-earth elements and the like besides Eu.

The raw materials of the composition formulas (1) to (4) are weighed in the proportions of: (1):(2)=1:0.1 to 1.0; (2):(3)=1:0.2 to 12.0; and (2):(4)=1:0.05 to 4.0, preferably (1):(2)=1:0.25 to 1.0; (2):(3)=1:0.3 to 6.0; and (2):(4)=1:0.05 to 3.0, and more preferably (1):(2)=1:0.25 to 1.0; (2):(3)=1:0.3 to 4.0; and (2):(4)=1:0.05 to 3.0 in terms of molar ratio, and the respective raw materials weighed are put in an alumina mortar, and subjected to grinding and mixing for about 30 minutes to obtain a raw material mixture. This raw material mixture is put in an alumina crucible, and subjected to firing at a temperature of 700° C. or more and less than 1100° C. for 3 to 40 hours in a predetermined atmosphere (H2:N2=5:95) in an electric furnace in a reducing atmosphere to obtain a fired product. This fired product is washed with warm pure water in a careful manner to wash away excess chloride, thereby succeeding in obtaining in the first phosphor. The first phosphor is excited by ultraviolet or short-wavelength visible light to emit visible light.

It is to be noted that the raw material (bivalent metal halide) of the composition formula (3) is preferably weighed in an excessive amount over the stoichiometric proportion. This comes from the consideration of the fact that the halogen element partially vaporizes and evaporates in the firing, for preventing crystal defects of the phosphor from being caused due to the lack of the halogen element. In addition, the excessively added raw material of the composition formula (3) is liquefied at the firing temperature to serve as a fusion agent for a solid-phase reaction, and thereby promote the solid-phase reaction and improve the crystallinity.

Further, the excessively added raw material of the composition formula (3) is present as impurities in the produced phosphor after firing the raw material mixture. Therefore, in order to achieve a phosphor which has a high degree of purity and a high luminescence intensity, these impurities may be washed away with warm pure water. The composition ratio shown in the general formula of the first phosphor according to the present embodiment refers to the composition ratio after washing away the impurities, and the raw material of the composition formula (3) added excessively to result in impurities as described above is not considered in this composition ratio.

(Second Fluorescent Body)

The second phosphor is a phosphor which has a luminescent color with a peak wavelength at 430 to 480 nm, for establishing a complementary relationship with the luminescent color of the first phosphor. This second phosphor efficiently absorbs near-ultraviolet or short-wavelength visible light, and emits light with a dominant wavelength of 440 to 470 nm. While phosphors which can be used as the second phosphor are not particularly limited on the composition, the second phosphor can be selected from among, for example, phosphors (1) to (4) represented by the following general formula.

(1) A phosphor represented by the general formula M1a(M2O4)bXc:Red (where M1 represents one or more elements including at least any of Ca, Sr, and Ba, which are selected from the group consisting of Ca, Sr, Ba, Mg, Zn, Cd, K, Ag, and Tl, M2 represents one or more elements including at least P, which are selected from the group consisting of P, V, Si, As, Mn, Co, Cr, Mo, W, and B, X represents at least one halogen element, and Re represents one or more elements including at least Eu2+, which are selected from the group consisting of rare-earth elements and Mn. In addition, a falls within the range of $4.2 \leq a \leq 5.8$, b falls within the range of $2.5 \leq b \leq 3.5$, c falls within the range of $0.8 \leq c \leq 1.4$, and d falls within the range of $0.01 < d < 0.1$.)

(2) A phosphor represented by the general formula M11-aMgAl10O17:Eu2+a (where M1 represents at least one or more elements selected from the group consisting of Ca, Sr, Ba, and Zn. In addition, a falls within the range of $0.001 \leq a \leq 0.5$.)

(3) A phosphor represented by the general formula M11-aMgSi2O8:Eu2+a (where M1 represents at least one or more elements selected from the group consisting of Ca, Sr, Ba, and Zn. In addition, a falls within the range of $0.001 \leq a \leq 0.8$.)

(4) A phosphor represented by the general formula M12-a(B5O9)X:Rea (where M1 represents at least one or more elements selected from the group consisting of Ca, Sr, Ba, and Zn, and X represents at least one halogen element. In addition, a falls within the range of $0.001 \leq a \leq 0.5$.)

The second phosphor can be obtained, for example, in the following way. For the second phosphor, with the use of CaCO3, MgCO3, CaCl2, CaHPO4, and Eu2O3 as raw materials, these raw materials are weighed in predetermined proportions so as to provide CaCO3:MgCO3:CaCl2:CaHPO4:Eu2O3=0.05 to 0.35:0.01 to 0.50:0.17 to 2.50:1.00:0.005 to 0.050 in terms of molar ratio, and the respective raw materials weighed are put in an alumina mortar, and subjected to grinding and mixing for about 30 minutes to obtain a raw material mixture. This raw material mixture is put in an alumina crucible, and subjected to firing at a temperature of 800° C. or more and less than 1200° C. for 3 hours in a N2 atmosphere containing 2 to 5% of H2 to obtain a fired product. This fired product is washed with warm pure water in a careful manner to wash away excess chloride, thereby succeeding in obtaining in the second phosphor. The second phosphor emits visible light which has a complementary relationship with the visible light emitted by the first phosphor.

It is to be noted that the CaCl2 (molar ratio) weighed for obtaining the previously mentioned raw material mixture is preferably weighed in an excessive amount of 0.5 mol or more over the stoichiometric proportion with respect to the composition ratio of the second phosphor produced. This can prevent the second phosphor from having crystal defects caused due to the lack of Cl.

EXAMPLES

While the phosphors and light emitting devices described above will be further specifically described below with reference to examples, the following descriptions of raw materials and production methods for phosphors and light emitting devices, the chemical compositions of the phosphors, etc. are not to be considered to limit embodiments of the phosphors and light emitting device according to the present invention in any way.

First, phosphors used in light emitting devices according to the present examples will be described in detail.

<Fluorescent Body 1>

The phosphor 1 is a type of the first phosphor, and a phosphor represented by (Ca0.47, Sr0.48, Eu0.05)7/6SiO3Cl2/6. The phosphor 1 is synthesized so that the respective contents x, y, and z of M2, M3, M4 are respectively 0.47, 0.48, and 0.05 with M1=Si, M2=Ca, M3=Sr, X=Cl, M4=Eu2+, m=7/6, and n=6 in the general formula (M2x, M3y, M4z)mM1O3X2/n. In addition, the phosphor 1 has cristobalite produced in the phosphor by excessively adding SiO2 in the mixing ratio of the raw materials. For the production of the phosphor 1, first, respective raw materials of SiO2, Ca(OH)2, SrCl2.6H2O, and Eu2O3 were weighed to provide SiO2:Ca(OH)2:SrCl2.6H2O:Eu2O3=1.1:0.45:1.0:0.13 in terms of molar ratio, and the respective raw materials weighed were put in an alumina mortar, and subjected to grinding and mixing for about 30 minutes to obtain a raw material mixture. This raw material mixture was put in an alumina crucible, and subjected to firing at a temperature of 1000° C. for 5 to 40 hours in a predetermined atmosphere (H2:N2=5:95) in an electric furnace in a reducing atmosphere to obtain a fired product. The fired product obtained was washed with warm pure water in a careful manner to obtain the phosphor 1.

<Fluorescent Body 2>

The phosphor 2 is a phosphor represented by (Ca4.67Mg0.5)(PO4)3Cl:Eu0.08. The phosphor 2 is an example of the second phosphor described above. The phosphor 2 is a phosphor synthesized so as to have M1=Ca/Mg (molar ratio: 90.3/9.7), M2=P, X=Cl, Re=Eu2+, a=5.17, b=3, c=1, and d=0.08 in the general formula M1a (M2O4)bXc:Red. For the production of the phosphor 2, first, respective raw materials of CaCO3, MgCO3, CaCl2, CaHPO4, and Eu2O3 were weighed to provide CaCO3: MgCO3: CaCl2: CaHPO4: Eu2O3=0.42:0.5:3.0:1.25:0.04 in terms of molar ratio, and the respective raw materials weighed were put in an alumina mortar, and subjected to grinding and mixing for about 30 minutes to obtain a raw material mixture. This raw material mixture was put in an alumina crucible, and subjected to firing at a temperature of 800° C. or more and less than 1200° C. for 3 hours in a N2 atmosphere containing 2 to 5% of H2 to obtain a fired product. The fired product obtained was washed with warm pure water in a careful manner to obtain the phosphor 2.

Next, the structures of light emitting devices according to examples and comparative examples will be described in detail.

<Structure of Light Emitting Device>

Example 1

For the light emitting device according to Example 1, the following specific components are used in a light emitting device which has the configuration shown in FIG. 1.

First, with the use of an aluminum nitride substrate as the substrate 12, gold was used to form the electrode 14 (anode) and the electrode 16 (cathode) on the surface of the substrate 12. As the semiconductor light emitting element 18, an LED of 1 mm square (SemiLEDs Corporation: MvpLEDTMSL-V-U40AC) is used which has an emission peak at 405 nm. Then, the lower surface of the LED described above was bonded onto a silver paste (Henkel Ablestik Japan Ltd.: 84-1LMISR4) delivered by drops onto the electrode 14 (anode) with the use of a dispenser, and the silver paste was subjected to curing for 1 hour under an environment of 175° C. In addition, with a gold wire of Φ 45 µm as the wire 22, this gold wire was bonded by ultrasonic thermocompression bonding to an upper electrode of the LED and the electrode 16 (cathode). In addition, with a silicone resin as a binder member, various types of phosphors were mixed into this silicone resin to prepare a fluorescent paste.

As a method for adjusting the fluorescent paste, first, the phosphor 1 and second phosphor 2 described above were mixed at a ratio by weight of 2:1, and adjusted so as to fall within the degree of whiteness. Then, a dimethyl silicone resin (Dow Corning Toray Silicone Co., Ltd.: JCR6126) was used as a matrix material for the preparation of the fluorescent paste, and weighed so as to have a phosphor concentration of 1 vol %. The fluorescent paste was prepared by filling a 10 cc ointment container with approximately 3 to 5 g of the weighed binder material and phosphors mentioned previously, and using a rotation-revolution mixer (MA-ZERUSTAR from KURABO Industries Ltd.) for mixing/defoaming for 90 seconds with 1200 revolutions and 400 rotations per second. It is to be noted that the phosphors may be subjected to a silane treatment, in order to ensure the dispersion of the phosphors in the preparation of the fluorescent paste. Then, the prepared fluorescent paste was used to form a dome in a hemispherical shape of 10 mm in radius on the upper surface of the semiconductor light emitting element 18, and then immobilized by curing for 1.5 hours under an environment of 150° C., to form the domal phosphor layer 24.

Example 2

For the light emitting device according to Example 2, the following specific components are used in a light emitting device which has the configuration shown in FIG. 2.

In the case of the light emitting device according to Example 2, as in the case of the light emitting device according to Example 1, an aluminum nitride substrate was used as a substrate, and gold was used to electrodes (an anode and a cathode) on the surface of the substrate. In addition, an LED of 1 mm square (SemiLEDs Corporation: MvpLEDTMSL-V-U40AC) with an emission peak at 405 nm was used as the semiconductor light emitting element 118, the lower surface of the LED described above was bonded onto a silver paste (Henkel Ablestik Japan Ltd.: 84-1LMISR4) delivered by drops onto the electrode (anode), not shown, with the use of a dispenser, and the silver paste was subjected to curing for 1 hour under an environment of 175° C. In addition, with a gold wire of Φ 45 μm as a wire (not shown), this gold wire was bonded by ultrasonic thermocompression bonding to an upper electrode of the LED and the electrode (cathode). Next, the phosphors were dispersed in the binder material listed below to prepare a fluorescent paste.

While the preparation method and phosphors used for the fluorescent paste are almost the same as in the case of Example 1, an adjustment is made so that the phosphor concentration is 2 vol %. In this case, the fluorescent paste is adjusted to a viscosity depending on the light transmission, dispersibility, and moldability/filling workability. Then, the semiconductor light emitting element 118 mounted on the substrate was coated with the fluorescent paste by using a processing method such as potting, compression molding, transfer molding, or injection molding.

For the binder material, a material is used which is transparent to near-ultraviolet or short-wavelength visible light (a transmission of 90% or more) and has favorable resistance to light. Specifically, silicone resins, fluorine resins, sol-gel glass, acrylic resins, inorganic binders, glass materials, etc. can be used. In addition, a diffusing agent and a thixotropic agent may be added to the binder paste. Specifically, examples include fine grains such as a silicon dioxide, a titanium oxide, an aluminum oxide, and a barium titanate.

In the case of the light emitting device according to Example 2, the phosphors in a predetermined amount were subjected to mixing/dispersion/defoaming in a silicone resin with silica fine grains dispersed as a thixotropic agent to prepare the fluorescent paste. Then, the fluorescent paste was applied onto the semiconductor light emitting element in a dispensing manner with the use of a dispenser, and then immobilized by curing for 1.5 hours under an environment of 150° C. Thus, the dimensions of the cured fluorescent paste obtained by potting resulted in a shape of about 4 to 6 mm in width, about 2 mm in height, and about 25 mm in length, with the semiconductor light emitting element 118 sealed.

Comparative Example 1

For the light emitting device according to Comparative Example 1, the following specific components are used in a light emitting device which has the configuration shown in FIG. 1. The light emitting device according to Comparative Example 1 has almost the same configuration as the light emitting device according to Example 1, and different components from those in the light emitting device according to Example 1 will be thus described below.

As the semiconductor light emitting element 18, an LED of 1 mm square (SemiLEDs Corporation: MvpLEDTMSL-V-B45AC) with an emission peak at 450 nm was used. As a phosphor, cerium-activated yttrium aluminum garnet (P46-Y3 from Kasei Optonix, Ltd.) was used.

A dimethyl silicone resin (Dow Corning Toray Silicone Co., Ltd.: JCR6126) was used as a matrix material for the preparation of a fluorescent paste, and weighed so that the concentration of the phosphor (YAG phosphor) described above was 1.05 vol %. The fluorescent paste was prepared by filling a 10 cc ointment container with approximately 3 to 5 g of the weighed binder material and phosphor mentioned previously, and using a rotation-revolution mixer (MA-ZERUSTAR from KURABO Industries Ltd.) for mixing/defoaming for 90 seconds with 1200 revolutions and 400 rotations per second. Then, the prepared fluorescent paste was used to form a dome in a hemispherical shape of 8 mm in radius on the upper surface of the semiconductor light emitting element 18, and then subjected to curing for 1.5 hours under an environment of 150° C., to form the domal phosphor layer 24.

Comparative Example 2

For the light emitting device according to Comparative Example 2, the following specific components are used in a light emitting device which has the configuration shown in FIG. 2. The light emitting device according to Comparative Example 2 has almost the same configuration as the light emitting device according to Example 2, and different components and preparation methods from those in the light emitting device according to Example 2 will be thus described below.

As the semiconductor light emitting element 118, an LED of 1 mm square (SemiLEDs Corporation: MvpLEDTMSL-V-U40AC) with an emission peak at 405 nm was used. As for phosphors, a europium-activated orthosilicate-based phosphor (WL-Y460 from Intematix Corporation) was used as the first phosphor, whereas the phosphor 2 used in Example 1 was used as the second phosphor.

As a method for adjusting a fluorescent paste, first, the first phosphor and second phosphor described above were mixed at a ratio by weight of 2:1, and adjusted so as to fall within the degree of whiteness. Then, a dimethyl silicone resin (Dow Corning Toray Silicone Co., Ltd.: JCR6126) was used as a matrix material for the preparation of the fluorescent paste, and weighed so as to have a phosphor concentration of 2 vol %. The fluorescent paste was prepared by filling a 10 cc dispensing container with approximately 3 to 5 g of the weighed binder material and phosphors mentioned previously, and using a rotation-revolution mixer (MAZERUSTAR from KURABO Industries Ltd.) for mixing/defoaming for 90 seconds with 1200 revolutions and 400 rotations per second. Then, the adjusted fluorescent paste was applied onto the semiconductor light emitting element in a dispensing manner with the use of a dispenser, and then immobilized by curing for 1.5 hours under an environment of 150° C. Thus, the dimensions of the cured fluorescent paste obtained by potting resulted in a shape of about 4 to 6 mm in width, about 2 mm in height, and about 25 mm in length, with the semiconductor light emitting element 118 sealed. It is to be noted that not only the domal shape (hemispherical shape) and semi-cylindrical shape described above, but also, for example, a lens shape such as a Fresnel lens can be also adopted as the shape of the resin paste.

<Evaluation of Examples>

The in-plane chromaticity distribution of the light emitting surface was measured for the light emitting devices according to Example 1 and Comparative Example 1. For the measurement device, a two-dimensional luminance meter (from Minolta Co., Ltd.) was used. Specifically, the light emitting surface (hemispherical dome) of Φ 10 mm (Example 1) or Φ 8 mm (Comparative Example 1) was divided into 40000 regions, and the chromaticity in each region was measured and plotted in a chromaticity diagram.

Figure 3:
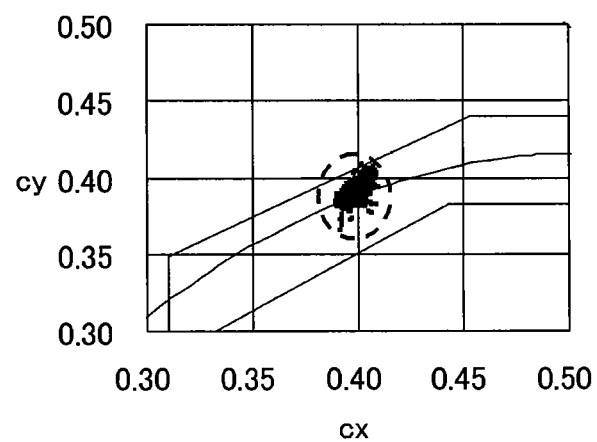
FIG. 3 is a diagram showing a chromaticity distribution at a light emitting surface of a light emitting device according to Example 1.
Figure 4:
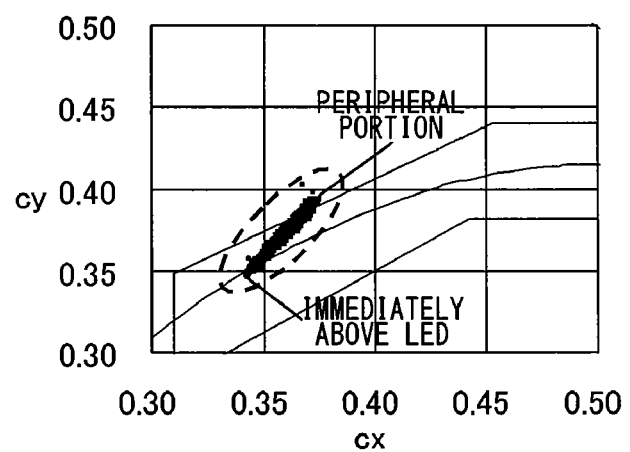
FIG. 4 is a diagram showing a chromaticity distribution at a light emitting surface of a light emitting device according to Comparative Example 1.

FIG. 3 is a diagram showing the chromaticity distribution at the light emitting surface of the light emitting device according to Example 1. FIG. 4 is a diagram showing the chromaticity distribution at the light emitting surface of the light emitting device according to Comparative Example 1. As shown in FIG. 3, light emitted by the light emitting device according to Example 1 has a very narrow chromaticity distribution, and small chromaticity fluctuation in the light emitting surface. Therefore, the light emitting device according to Example 1 achieves uniform white light over the entire light emitting surface.

In contrast, light emitted by the light emitting device according to Comparative Example 1 is bluish white in a central portion of the dome, and tinged with yellow in a peripheral portion thereof. Therefore, as shown in FIG. 4, it is found that the light emitted by the light emitting device according to Comparative Example 1 has a broad chromaticity distribution along the chromaticity line of blue-yellow, and large color hue variability.

Figure 5:
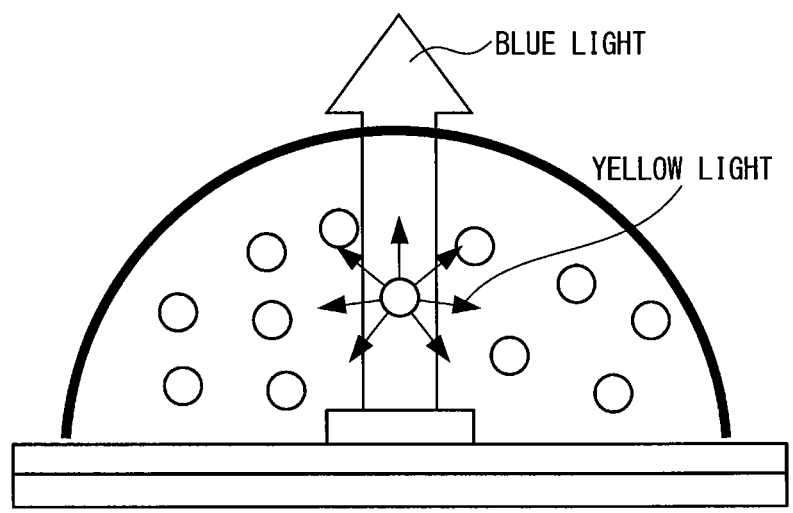
FIG. 5 is a diagram schematically illustrating a light emitting model for the light emitting device according to Comparative Example 1.

The reason that the large difference is produced in chromaticity distribution between the light emitting device according to Example 1 and the light emitting device according to Comparative Example 1 is considered as follows. In the case of the whitening system (the blue LED+the YAG phosphor) for the light emitting device according to Comparative Example 1, blue light is emitted from the blue LED in a vertical direction, whereas the phosphor which absorbs the blue light produces luminescence in a Lambertian manner. FIG. 5 is a diagram schematically illustrating a light emitting model for the light emitting device according to Comparative Example 1. As shown in FIG. 5, bluish white light is emitted immediately above the dome, whereas yellow light is emitted near the periphery of the dome, and the luminescent color is considered to vary depending on the irradiation direction.

Figure 6:
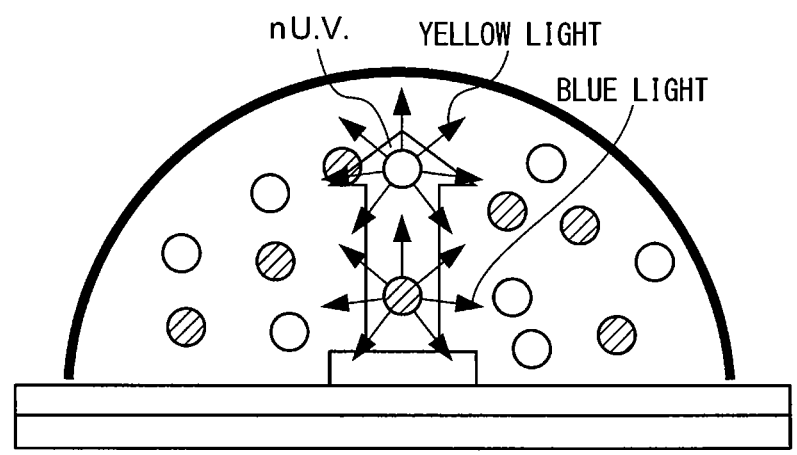
FIG. 6 is a diagram schematically illustrating a light emitting model for the light emitting device according to Example 1.

FIG. 6 is a diagram schematically illustrating a light emitting model for the light emitting device according to Example 1. As shown in FIG. 6, in the light emitting device according to Example 1, almost all of ultraviolet or short-wavelength visible light emitted from the nUV-LED is absorbed by the phosphors, and luminescence is produced in a Lambertian manner in the first phosphor (Y) and the second phosphor (B). Moreover, because the first phosphor hardly absorbs blue light, the luminescent color is less likely to undergo a change even when the resin layer containing the phosphors varies in thickness. As a result, it is considered that fluctuation can be suppressed in the chromaticity distribution of the luminescent color.

Figure 7:
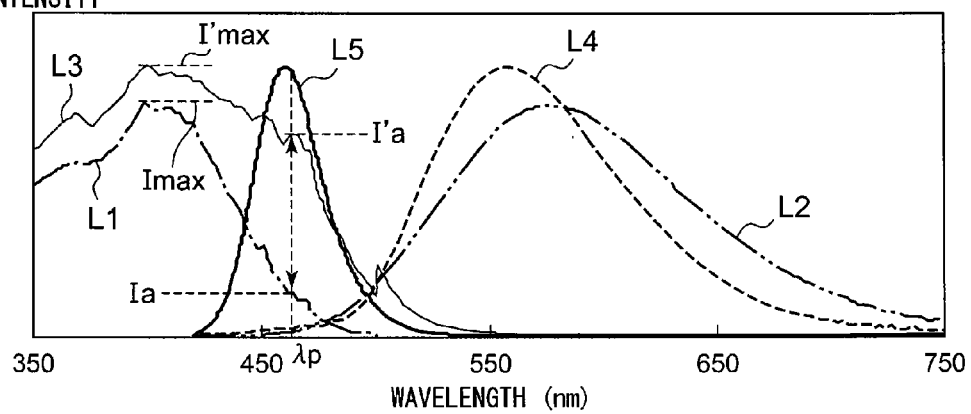
FIG. 7 is a diagram showing emission spectra and excitation spectra for phosphors for use in light emitting devices in Example 2 and Comparative Example 2.

Next, the influence of cascade excitation on color hue variability will be described in the light emitting devices according to Example 2 and Comparative Example 2. FIG. 7 is a diagram showing emission spectra and excitation spectra for phosphors for use in the light emitting devices in Example 2 and Comparative Example 2. In this figure, a line L1 and a line L2 respectively indicate an excitation spectrum for the first phosphor used in Example 2 and an emission spectrum for the first phosphor used in Example 2. In addition, a line L3 and a line L4 respectively indicate an excitation spectrum for the first phosphor used in Comparative Example 2 and an emission spectrum for the first phosphor used in Comparative Example 2. Further, a line L5 indicates an emission spectrum for the second phosphor used in Example 2 and Comparative Example 2.

As shown in FIG. 7, the excitation spectrum (line L1) for the first phosphor in the light emitting device according to Example 2 has a small region overlapping with the emission spectrum (line L5) for the second phosphor therein. More specifically, when Imax and Ia respectively are assumed to denote the maximum intensity of the excitation spectrum for the first phosphor and the intensity of the excitation spectrum for the first phosphor at the peak wavelength $\lambda p$ of the emission spectrum for the second phosphor, $Ia<0.5\times Imax$ is satisfied. Thus, in the light emitting device according to Example 2, light emitted from the second phosphor is prevented from being absorbed by the first phosphor to produce luminescence again.

It is to be noted that the volume concentration of all of the phosphors contained in the phosphor layer in each example is preferably 0.05 vol % or more and 10 vol % or less. As long as the volume concentration of all of the phosphors is 0.05 vol % or more, somewhat bright light is obtained. In addition, as long as the volume concentration of all of the phosphors is 10 vol % or less, scattering and attenuation can be reduced which are caused between phosphor grains. In addition, the phosphor layer preferably has an optical path length of 0.4 mm or more and 20 mm or less from incidence of light from the semiconductor light emitting element to exit thereof to the outside. As long as the optical path length is 0.4 mm or more, the phosphors contained in the phosphor layer can adequately absorb primary light emitted by the semiconductor light emitting element. In addition, as long as the optical path length is 20 mm or less, there is a reduced possibility that light emitted by a phosphor is absorbed by the other phosphor to produce luminescence again. In addition, the first phosphor preferably has an average grain size of 0.5 µm or more and 100 µm or less, whereas the second phosphor preferably has an average grain size of 0.5 µm or more and 100 µm or less. The grain size of 0.5 µm or more can reduce the ratio of a grain surface layer which is low in phosphor activity, and thus improve the luminescent efficiency. In addition, the grain size of 100 µm or less makes it easy to disperse the phosphors in the phosphor layer.

As described above, the light emitting devices according to the examples achieve white light by mixing visible light with a peak wavelength in a wavelength range of 560 nm to 600 nm, which is emitted from the first phosphor excited by ultraviolet or short-wavelength visible light, with visible light which has a complementary relationship with visible light emitted by the first phosphor, which is emitted by the second phosphor excited by ultraviolet or short-wavelength visible light. Therefore, as compared with the light emitting device according to Comparative Example 1 with the blue light emitting element combined with the yellow phosphor, the chromaticity fluctuation is suppressed in the light emitting surface. In addition, the volume concentration of the phosphors in the phosphor layer and the optical path length (the shape and thickness of the phosphor layer) are set appropriately to cause the phosphors to efficiently absorb light emitted by the light emitting element, and suppress the absorption and scattering of light emitted by the phosphor in and on the other phosphor.

On the other hand, the excitation spectrum (line L3) for the first phosphor in the light emitting device according to Comparative Example 2 has a large region overlapping with the emission spectrum (line L5) for the second phosphor therein. More specifically, when I'max and I'a respectively are assumed to denote the maximum intensity of the excitation spectrum for the first phosphor and the intensity of the excitation spectrum for the first phosphor at the peak wavelength λp of the emission spectrum for the second phosphor, I'a<0.5×I'max is not satisfied. Thus, the first phosphor in the light emitting device according to Comparative Example 2 has a high excitation intensity in the emission wavelength range of the second phosphor, and the first phosphor absorbs much of light emitted from the second phosphor to produce luminescence again. Therefore, it is determined that cascade excitation is caused in the light emitting device according to Comparative Example 2.

Next, an emission spectrum will be described in the case of the phosphors in powder form. Specifically, the two types of phosphors (the first phosphor and the second phosphor) for use in Example 2 and Comparative Example 2 were mixed with each other to synthesize a mixed powder for emitting white light. The mixture of the phosphors is obtained by weighing each of the two types of phosphor powders in predetermined amounts, and putting the weighed powders in a powder shaker for dry mixing. Then, this mixed powder was irradiated with excitation light of 400 nm in wavelength for excitation.

Figure 8:
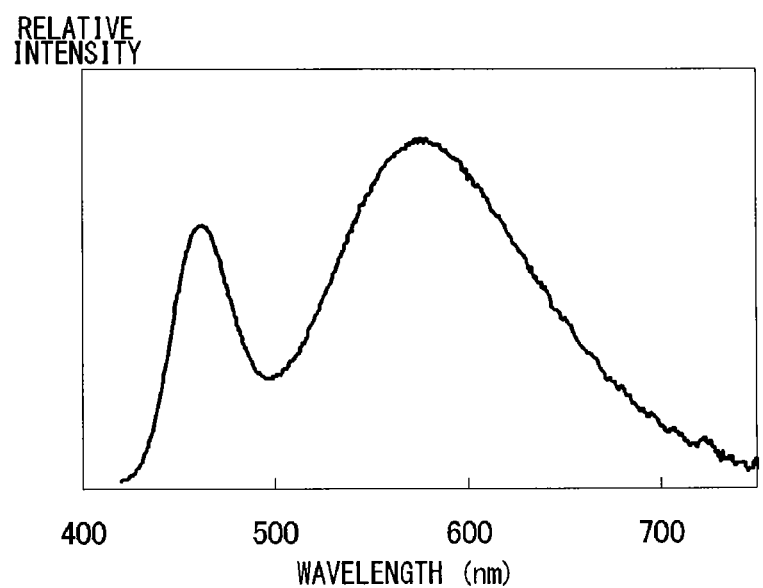
FIG. 8 is a diagram showing an emission spectrum in the case of exciting a mixed powder of a phosphor 1 and a phosphor 2 for use in the light emitting device according to Example 2.
Figure 9:
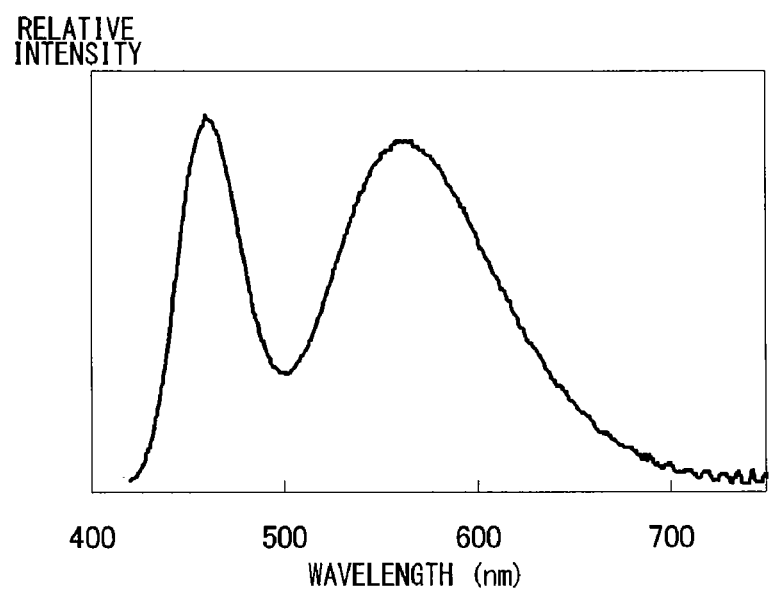
FIG. 9 is a diagram showing an emission spectrum in the case of exciting a mixed powder of an orthosilicate-based phosphor and the phosphor 2 described above for use in the light emitting device according to Comparative Example 2.

FIG. 8 is a diagram showing an emission spectrum in the case of exciting a mixed powder of the phosphor 1 and phosphor 2 for use in the light emitting device according to Example 2. FIG. 9 is a diagram showing an emission spectrum in the case of exciting a mixed powder of an orthosilicate-based phosphor and the phosphor 2 described above for use in the light emitting device according to Comparative Example 2.

Figure 10:
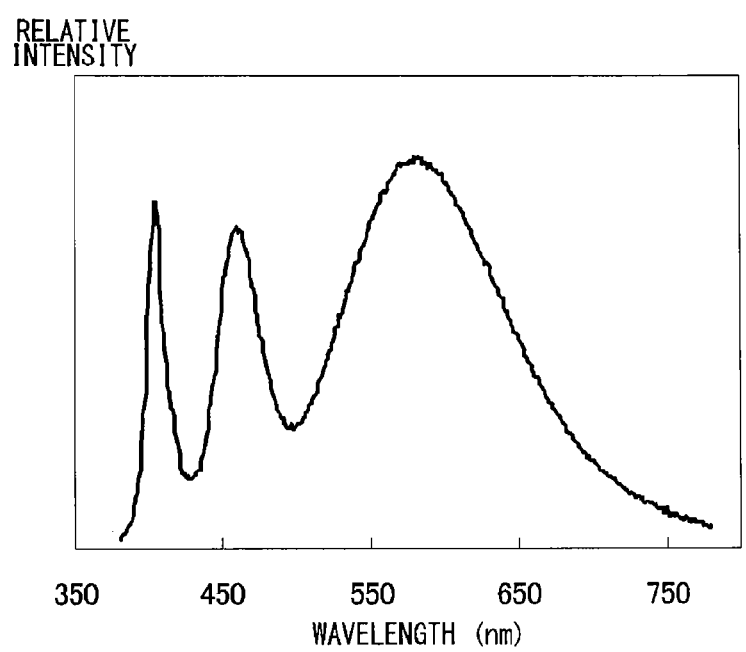
FIG. 10 is a diagram showing an emission spectrum for the light emitting device according to Example 2.
Figure 11:
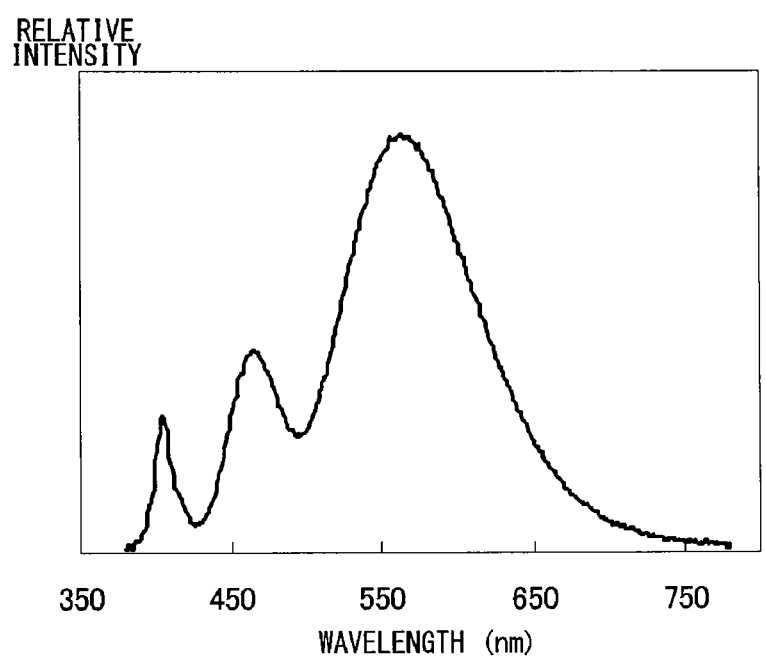
FIG. 11 is a diagram showing an emission spectrum for the light emitting device according to Comparative Example 2.

Next, emission spectra will be described for the light emitting devices according to Example 2 and Comparative Example 2. A driving current of 350 mA was applied to each of the light emitting devices produced as described above to determine emission spectra. FIG. 10 is a diagram showing an emission spectrum for the light emitting device according to Example 2. FIG. 11 is a diagram showing an emission spectrum for the light emitting device according to Comparative Example 2.

In the case of the combination of the phosphors according to Example 2, almost equivalent emission spectra are obtained when the emission spectra are compared between the case of the powder phosphor (FIG. 8) and the case of the light emitting device (FIG. 10). On the other hand, in the case of the combination of the phosphors according to Comparative Example 2, substantially different emission spectra are provided when the emission spectra are compared between the case of the powder phosphor (FIG. 9) and the case of the light emitting device (FIG. 11). Table 1 shows the chromaticity coordinates (Cx, Cy) for the four emission spectra described above.

TABLE 1

|  | EXAMPLE 2 | | COMPARATIVE EXAMPLE 2 | |
| --- | --- | --- | --- | --- |
|  | c x | c y | c x | c y |
| WHITE LED | 0.384 | 0.374 | 0.381 | 0.440 |
| POWDER PHOSPHOR | 0.388 | 0.394 | 0.335 | 0.367 |
| COLOR DIFFERENCE | 0.021 | | 0.086 | |

As shown in Table 1, in the case of the combination of the phosphors in Example 2, there is no substantial difference between luminescent chromaticity in the form of the powder phosphor and luminescent chromaticity as the light emitting device (white LED), and the chromaticity adjusted in the form of powder phosphor is also reproduced generally as in the case of the light emitting device. On the other hand, in the case of the combination of the phosphors in Comparative Example 2, which causes cascade excitation, the chromaticity varies substantially in the case of the light emitting device (white LED) even when the chromaticity is adjusted in the state of the fluorescent powder.

Figure 12:
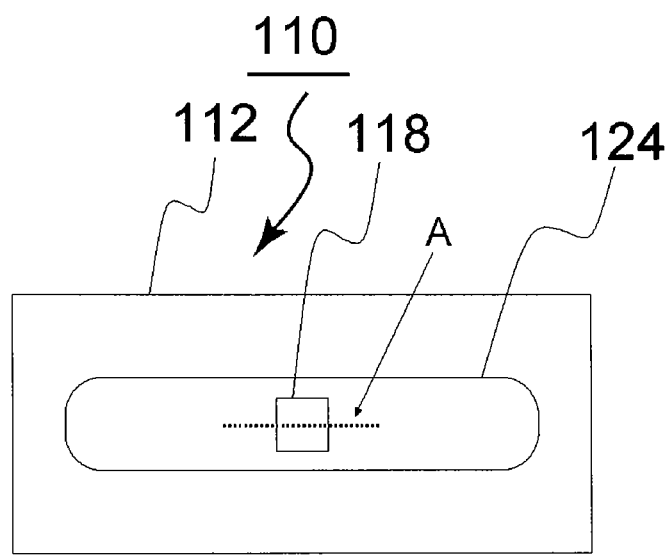
FIG. 12 is a pattern diagram illustrating points to be measured for the light emitting devices according to Example 2 and Comparative Example 2.

Next, the in-plane chromaticity distribution of the light emitting surface was measured for the light emitting devices according to Example 2 and Comparative Example 2. FIG. 12 is a pattern diagram illustrating points to be measured for the light emitting devices according to Example 2 and Comparative Example 2. The measurement method is the same as in the case of Example 1 and Comparative Example 1. As shown in FIG. 12, the chromaticity was measured for the points 3 mm away from the center of the semiconductor light emitting element 118 on each side thereof along a central line A in a longitudinal direction of the light emitting device 110.

Figure 13:
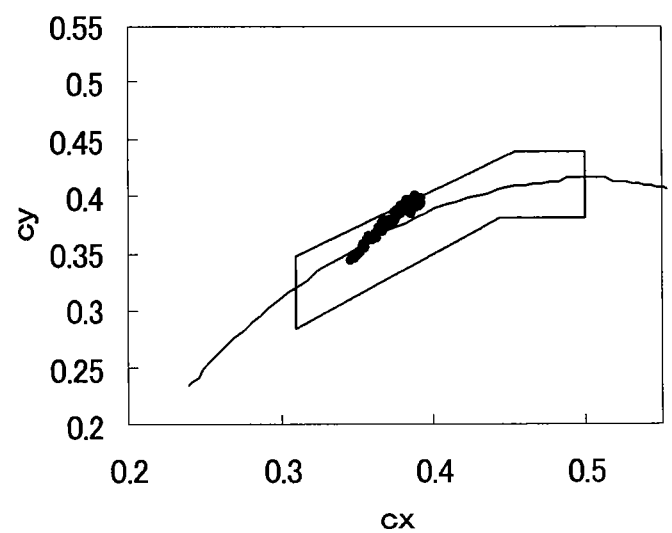
FIG. 13 is a diagram showing a chromaticity distribution at a light emitting surface of the light emitting device according to Example 2.
Figure 14:
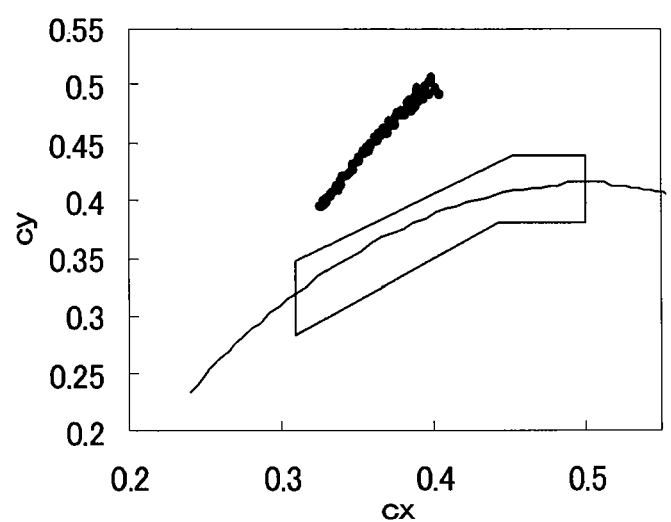
FIG. 14 is a diagram showing a chromaticity distribution at a light emitting surface of the light emitting device according to Comparative Example 2.

FIG. 13 is a diagram showing a chromaticity distribution at a light emitting surface of the light emitting device according to Example 2. FIG. 14 is a diagram showing a chromaticity distribution at a light emitting surface of the light emitting device according to Comparative Example 2. As shown in FIG. 13, the light emitting device according to Example 2 emits light in a white region, and also has small chromaticity fluctuation in the light emission surface. However, a slight blue shift is observed immediately above the semiconductor light emitting element (chip) 118, because the ratio of leaked light is increased with respect to ultraviolet or short-wavelength visible light as primary light from the light emitting element. On the other hand, the light emitting device according to Comparative Example 2 causes cascade excitation, blue light is thus absorbed again to cause a yellow shift totally, which deviates widely from the whiteness range. In addition, it is observed that the color difference is also increased between immediately above the semiconductor light emitting element (chip) 118 and each side thereof.

The present invention has been described above with reference to the embodiments and examples. These embodiments are by way of example, and it is to be understood by one skilled in the art that various modification examples are possible for the respective components and the combinations of the respective processes in the embodiments, and that such modification examples also fall within the scope of the present invention.

INDUSTRIAL APPLICABILITY

The light emitting device according to the present invention can be utilized for various types of lamp fittings, for example, lamp fittings for lighting, displays, lamp fittings for vehicles, traffic light, etc.

DESCRIPTION OF REFERENCE NUMERALS 10 light emitting device, 12 substrate, 14, 16 electrode, 17 reflecting surface, 18 semiconductor light emitting element, 19 phosphor, 20 mounting member, 22 wire, 24 phosphor layer, 118 semiconductor light emitting element, 124 phosphor layer.

What is claimed is:
1. A light emitting device configured to achieve a white color by mixing light from respective phosphors, the light emitting device comprising:
   a light emitting element for emitting ultraviolet or short-wavelength visible light having a peak wavelength in a wavelength range of 380 to 420 nm;
   a first phosphor excited by the ultraviolet or short-wavelength visible light to emit visible light having a peak wavelength in a wavelength range of 560 nm to 600 nm;
   a second phosphor excited by the ultraviolet or short-wavelength visible light to emit visible light having a complementary relationship with visible light emitted by the first phosphor; and
   a light transmitting member which is a light transmitting layer for covering the light emitting element, and has the first phosphor and the second phosphor dispersed therein, wherein
      the volume concentration of all of the phosphors contained in the light transmitting member is 0.05 vol % or more and 10 vol % or less,
      the light transmitting member is configured to have an optical path length of 0.4 mm or more and 20 mm or less from incidence of light from the light emitting element to exit thereof to the outside,
      the first phosphor has an average grain size of 0.5 μm or more and 100 μm or less, and
      the second phosphor has an average grain size of 0.5 μm or more and 100 μm or less.
2. The light emitting device according to claim 1, wherein the light transmitting member has a domal shape.
3. The light emitting device according to claim 1, wherein the light transmitting member has a Fresnel lens shape.
4. The light emitting device according to claim 1, wherein when Imax and Ia respectively are assumed to denote the maximum intensity of an excitation spectrum for the first phosphor and the intensity of the excitation spectrum for the first phosphor at a peak wavelength of an emission spectrum for the second phosphor, Ia<0.5×Imax is satisfied.
5. The light emitting device according to claim 1, wherein the first phosphor is represented by a general formula $(M^2_x, M^3_y, M^4_z)_M M^1 O_3 X_{(2/n)}$ where
   (i) $M^1$ represents one or more elements including at least Si, which are selected from the group consisting of Si, Ge, Ti, Zr, and Sn,
   (ii) $M^2$ represents one or more elements including at least Ca, which are selected from the group consisting of Ca, Mg, Ba, and Zn,
   (iii) $M^3$ represents one or more elements including at least Sr, which are selected from the group consisting of Sr, Mg, Ba, and Zn,
   (iv) X represents at least one halogen element,
   (v) $M^4$ represents one or more elements including at least $Eu^{2+}$, which are selected from the group consisting of rare-earth elements and Mn,
   (vi) m falls within the range of 1≤m≤4/3,
   (vii) n falls within the range of 5≤n≤7, and
   (viii) x, y, z fall within ranges which satisfy x+y+z=1, 0<x<0.99, 0<y<0.99, 0.01≤z≤0.3).
6. The light emitting device according to claim 1, wherein the second phosphor emits visible light with a peak wavelength in a wavelength range of 430 nm to 480 nm.
7. The light emitting device according to claim 6, wherein the second phosphor is represented by a general formula $M^1_a(M^2O_4)_b X_c$:$Re_d$ where
   (i) $M^1$ represents one or more elements including at least any of Ca, Sr, and Ba, which are selected from the group consisting of Ca, Sr, Ba, Mg, Zn, Cd, K, Ag, and Tl,
   (ii) $M^2$ represents one or more elements including at least P, which are selected from the group consisting of P, V, Si, As, Mn, Co, Cr, Mo, W, and B,
   (iii) X represents at least one halogen element,
   (iv) Re represents one or more elements including at least $EU^{2+}$, which are selected from the group consisting of rare earth elements and Mn,
   (v) a falls within the range of 4.2≤a≤5.8,
   (vi) b falls within the range of 2.5≤b≤3.5,
   (vii) c falls within the range of 0.8≤c≤1.4, and
   (viii) d falls within the range of 0.01<d<0.1.
8. A light emitting device configured to achieve a white color by mixing light from respective phosphors, the light emitting device comprising:
   a light emitting element for emitting ultraviolet or short-wavelength visible light having a peak wavelength in a wavelength range of 380 to 420 nm;
   a first phosphor excited by the ultraviolet or short-wavelength visible light to emit visible light having a peak wavelength in a wavelength range of 560 nm to 600 nm;
   a second phosphor excited by the ultraviolet or short-wavelength visible light to emit visible light having a complementary relationship with visible light emitted by the first phosphor; and
   a light transmitting member which is a light transmitting layer for covering the light emitting element, and has the first phosphor and the second phosphor dispersed therein, wherein
      the volume concentration of all of the phosphors contained in the light transmitting member is 0.05 vol % or more and 10 vol % or less, and
      the light transmitting member is configured to have an optical path length of 0.4 mm or more and 20 mm or less from incidence of light from the light emitting element to exit thereof to the outside, and
      when Imax and Ia respectively are assumed to denote the maximum intensity of an excitation spectrum for the first phosphor and the intensity of the excitation spectrum for the first phosphor at a peak wavelength of an emission spectrum for the second phosphor, Ia<0.5× Imax is satisfied.
9. The light emitting device according to claim 8, wherein the first phosphor is represented by a general formula $(M^2_x, M^3_y, M^4_z)_m M^1 O_3 X_{(2/n)}$ where
   (i) $M^1$ represents one or more elements including at least Si, which are selected from the group consisting of Si, Ge, Ti, Zr, and Sn,

(ii) $M^2$ represents one or more elements including at least Ca, which are selected from the group consisting of Ca, Mg, Ba, and Zn, (iii) $M^3$ represents one or more elements including at least Sr, which are selected from the group consisting of Sr, Mg, Ba, and Zn, (iv) X represents at least one halogen element, (v) $M^4$ represents one or more elements including at least $Eu^{2+}$, which are selected from the group consisting of rare-earth elements and Mn, (vi) m falls within the range of $1 \leq m \leq 4/3$, (vii) n falls within the range of $5 \leq n \leq 7$, and (viii) x, y, z fall within ranges which satisfy $x+y+z=1$, $0<x<0.99$, $0<y<0.99$, $0.01 \leq z \leq 0.3$.

10. The light emitting device according to claim 8, wherein the second phosphor emits visible light with a peak wavelength in a wavelength range of 430 nm to 480 nm.

11. The light emitting device according to claim 10, wherein the second phosphor is represented by a general formula $M^1_a(M^2O_4)_b X_c$: $Re_d$ where (i) $M^1$ represents one or more elements including at least any of Ca, Sr, and Ba, which are selected from the group consisting of Ca, Sr, Ba, Mg, Zn, Cd, K, Ag, and Tl, (ii) $M^2$ represents one or more elements including at least P, which are selected from the group consisting of P, V, Si, As, Mn, Co, Cr, Mo, W, and B, (iii) X represents at least one halogen element, (iv) Re represents one or more elements including at least $EU^{2+}$, which are selected from the group consisting of rare-earth elements and Mn, (v) a falls within the range of $4.2 \leq a \leq 5.8$, (vi) b falls within the range of $2.5 \leq b \leq 3.5$, (vii) c falls within the range of $0.8 \leq c \leq 1.4$, and (viii) d falls within the range of $0.01 < d < 0.1$.

12. A light emitting device configured to achieve a white color by mixing light from respective phosphors, the light emitting device comprising:

a light emitting element for emitting ultraviolet or short-wavelength visible light having a peak wavelength in a wavelength range of 380 to 420 nm;

a first phosphor excited by the ultraviolet or short-wavelength visible light to emit visible light having a peak wavelength in a wavelength range of 560 nm to 600 nm;

a second phosphor excited by the ultraviolet or short-wavelength visible light to emit visible light having a complementary relationship with visible light emitted by the first phosphor; and a light transmitting member which is a light transmitting layer for covering the light emitting element, and has the first phosphor and the second phosphor dispersed therein, wherein the volume concentration of all of the phosphors contained in the light transmitting member is 0.05 vol % or more and 10 vol % or less, the light transmitting member is configured to have an optical path length of 0.4 mm or more and 20 mm or less from incidence of light from the light emitting element to exit thereof to the outside, and the first phosphor is represented by a general formula $(M^2_x, M^3_y, M^4_z)_m M^1 O_3 X_{(2/n)}$ where (i) $M^1$ represents one or more elements including at least Si, which are selected from the group consisting of Si, Ge, Ti, Zr, and Sn, (ii) $M^2$ represents one or more elements including at least Ca, which are selected from the group consisting of Ca, Mg, Ba, and Zn, (iii) $M^3$ represents one or more elements including at least Sr, which are selected from the group consisting of Sr, Mg, Ba, and Zn, (iv) X represents at least one halogen element, (v) $M^4$ represents one or more elements including at least $Eu^{2+}$, which are selected from the group consisting of rare-earth elements and Mn, (vi) m falls within the range of $1 \leq m \leq 4/3$, (vii) n falls within the range of $5 \leq n \leq 7$, and (viii) x, y, z fall within ranges which satisfy $x+y+z=1$, $0<x<0.99$, $0<y<0.99$, $0.01 \leq z \leq 0.3$).

13. The light emitting device according to claim 12, wherein the second phosphor emits visible light with a peak wavelength in a wavelength range of 430 nm to 480 nm.

14. The light emitting device according to claim 13, wherein the second phosphor is represented by a general formula $M^1_a(M^2O_4)_b X_c$: $Re_d$ where (i) $M^1$ represents one or more elements including at least any of Ca, Sr, and Ba, which are selected from the group consisting of Ca, Sr, Ba, Mg, Zn, Cd, K, Ag, and Tl, (ii) $M^2$ represents one or more elements including at least P, which are selected from the group consisting of P, V, Si, As, Mn, Co, Cr, Mo, W, and B, (iii) X represents at least one halogen element, (vi) Re represents one or more elements including at least $EU^{2+}$, which are selected from the group consisting of rare-earth elements and Mn, (v) a falls within the range of $4.2 \leq a \leq 5.8$, (vi) b falls within the range of $2.5 \leq b \leq 3.5$, (vii) c falls within the range of $0.8 \leq c \leq 1.4$, and (viii) d falls within the range of $0.01 < d < 0.1$.

* * * * *